United States Patent [19]

Strasser et al.

[11] Patent Number: 5,400,317

[45] Date of Patent: Mar. 21, 1995

[54] METHOD OF COATING A WORKPIECE OF A PLASTIC MATERIAL BY A METAL LAYER

[75] Inventors: Gregor Strasser, Vaduz, Liechtenstein; Michael Hennessey, Detroit, Mich.

[73] Assignees: Balzers Aktiengesellschaft, Liechtenstein; Producers Color Service, Inc., Southfield, Mich.

[21] Appl. No.: 41,788

[22] Filed: Apr. 1, 1993

[51] Int. Cl.$^6$ .................. G11B 7/26; B05D 3/00; C23C 14/00

[52] U.S. Cl. ................. 369/275.1; 369/13; 369/272; 369/275.5; 369/283; 430/271; 430/495; 427/294; 204/192.14; 204/192.27

[58] Field of Search .............. 369/13, 272, 275.1, 369/275.5, 283; 428/960, 694, 928; 204/192.27, 192.14, 192.15, 192.26; 430/271, 485; 427/294

[56] References Cited

U.S. PATENT DOCUMENTS

| | | | |
|---|---|---|---|
| 4,824,699 | 4/1989 | Woo et al. | 427/307 |
| 4,833,043 | 5/1989 | Gardner | 369/13 |
| 4,839,207 | 6/1989 | Yoshitomi et al. | 369/272 |
| 4,957,603 | 9/1990 | Hennessey | 204/192.27 |
| 5,013,635 | 5/1991 | Ohkawa et al. | 430/495 |
| 5,017,073 | 5/1991 | Strasser et al. | 414/217 |
| 5,068,021 | 11/1991 | Sichmann et al. | 204/192.14 |
| 5,089,375 | 2/1992 | Gotoh et al. | 430/271 |
| 5,158,834 | 10/1992 | Funkenbusch | 369/13 |
| 5,245,736 | 9/1993 | Schertler | 29/33 |

FOREIGN PATENT DOCUMENTS

| | | |
|---|---|---|
| 0422323 | 4/1991 | European Pat. Off. |
| 0507113 | 10/1992 | European Pat. Off. |
| 4004116 | 8/1991 | Germany |
| 4117969 | 3/1992 | Germany |

*Primary Examiner*—Paul M. Dzierzynski
*Assistant Examiner*—Kim-Kwok Chu
*Attorney, Agent, or Firm*—Notaro & Michalos

[57] ABSTRACT

An optical storage disk has a body made of PMMA bulk material with a surface of PMMA. Aluminum or an aluminum alloy, light reflecting layer coats the PMMA surface and is applied using a sputtering apparatus in a sealed gas atmosphere containing argon and carbon containing gas. Application of the coating using sputtering takes place immediately after the PMMA body is inserted into the sealed gas atmosphere and without any pretreatment to the PMMA surface.

9 Claims, 1 Drawing Sheet

METHOD OF COATING A WORKPIECE OF A PLASTIC MATERIAL BY A METAL LAYER

BACKGROUND OF THE INVENTION

1. Field of the Invention

The invention relates to a method of coating workpieces of a plastic material with a metallic layer. The coating is precipitated onto the workpiece of a plastic material by means of the well-known cathode sputtering method in a vacuum chamber. Such coatings specifically find application for the production of optical data storage disks. To provide information on such disks for instance magneto-optical or phase change recording processes are used where the information is stored in the coating layer itself or in other optical recording processes, the information is embossed in the disk body underlying the coating by an injection moulding process in which the disk body is then coated with a highly reflective coating so that a laser beam can accordingly scan the information. For cost reasons the disk body is nowadays made of a plastic material. Coating of such plastic material must, however, proceed in such a manner that the coating layer bonds with a sufficiently high adherent strength on the disk body and the coating method does not damage the disk body, especially if provided with said information. With regard to these demands plastic materials are specifically difficult to coat. Such plastic materials, e.g. PMMA, are today commonly used for the production of e.g. laser video disks (LD).

2. Description of the Prior Art

Various treatment processes for increasing the environmental stability and the adhesion of sputter deposited layers on such plastic bodies are known. The environmental stability is usually tested by exposing the coated piece to elevated temperature and humidity conditions, as exemplified below.

Treatment of the surface of the plastic material by means of a plasma is known e.g. from the lecture of G. Legeay, "Surface Modification of natural or synthetic polymers by cold Plasmas", held at the 2nd Conf. Plasma Chem. Tech. 1984. Thereby the surface of a plastic material body is modified by the plasma treatment in such a manner that a subsequently deposited layer adheres better, Gases used for the plasma generation are for instance gases containing oxygen, helium and carbon. The use of helium or oxygen plasma discharges for a treatment of plastic surfaces is also known by the technical writing of J. Hall from: J. Appl. Polym. Sci. Vol. 13, 1969. The object of the plasma treatment is thereby to allow an improved adhesive bonding property to plastic materials. A further technical article of J. Hollahan from: J. Appl. Polym. Sci. Vol. 13, 1969, discloses to subject plastic material surface to a plasma treatment with gas containing ammonia, nitrogen and hydrogen in order to improve the surface adherence property and the wetting capability. For this application use is made of a high frequency plasma discharge.

The U.S. Pat. No. 4,957,603 discloses a coating method for optical storage disks of PMMA. This specification mentions that PMMA (Polymethylmetalcrylate) plastic materials are specifically difficult to be coated by cathode sputtering.

Thereby it is recognized that cathode sputtering would be more amenable to automatic mass production than vapor deposition, but that the problems associated with the environmental stability and adhesion of the sputter coated substrate body would vitiate using such cathode sputtering.

The author of said patent has noted a considerable improvement in the adhesion of a sputter coated metal layer on PMMA when creating an interface polymer which apparently reduces adhesion loss between a sputter deposited metal layer and the bulk of PMMA substrate. It is proposed that before sputter depositing the metal layer, the bulk surface is pretreated in a gas atmosphere comprised of a gas mixture containing argon and a carbon containing gas.

Although the author proposes in one embodiment to perform the sputtering operation of nickel itself using a mixed methane and argon sputtering gas, so that the beneficial surface modification and sputter deposition takes place simultaneously, all that reference clearly discloses is, due to the very low deposition rate of the system used for this work, that pretreating of the bulk substrate surface in a pretreating gas mixture atmosphere, before substantial metallic sputter deposition has occurred, is important.

This is in complete agreement with the mechanism believed to take place by the said author, according to which the excess carbon during exposition of the bulk material to a high energy plasma is believed to modify the bulk polymer surface in such a way to enhance adherence of the subsequently sputter deposited metal film.

The described technique has the sole, but serious disadvantage of essentially and practically necessitating a preparatory process step to pretreat the bulk substrate surface in the sense that a maximal rate metal deposition does not take place from the very beginning of the process, due to system speed limitation. The low deposition rate allows the plastic substrate to be exposed to the mixed gas plasma for a length of time that essentially constitutes a pretreatment step. This lengthens the overall processing time for such workpieces.

Multi-step magnetron sputter coating processes of PMMA bodies with a metallic layer are known with other gas mixtures. Thus, e.g. it is known from the German laid open print no. 40 04 116 to first perform the metal layer deposition by short time sputtering in an argon atmosphere, then to continue in a gas atmosphere of argon and helium and lastly to finish the coating process in a pure argon atmosphere.

In the European patent application no. 0 422 323 a PMMA substrate is magnetron sputter coated with an aluminum coating in a gas atmosphere containing helium.

The summarized drawbacks of such known techniques are:
using a pretreating phase at least at a reduced sputter rate for the metal in an argon/methane atmosphere for preparing the surface of the plastic material substrate or body before applying the metal coating by full-rate sputtering lengthens the overall process time;
magnetron sputter coating such plastic material surface in an atmosphere containing helium results in a longer process time, because helium reduces the yield of sputtered material. Additionally such coatings show a relatively low environmental stability.

From J. Vac. Sci. Technol. A, Vol. 10, N04, July/August 1992, S. Schulz et al., "Thin-film development and methods for compact disk and laser disk manufacturing", a cycle time of 13 sec for sputter coating of PMMA-LD is known.

SUMMARY OF THE INVENTION

Hence, it is a general object of the present invention to improve economical processing of plastic material metal coating in a vacuum chamber by means of cathodic sputtering, thereby achieving good adherence and good environmental stability of such layers.

A particular application is the metallisation of laser disks, especially of PMMA laser disks.

This is achieved by a method of coating a workpiece of a plastic material by a metallic layer in a vacuum chamber by means of magnetic field enhanced sputtering a predominant component material of said layer, which comprises the steps of performing said sputtering in a gas atmosphere of a gas mixture of argon and a carbon containing gas at least during a predominant time span of coating said workpiece with said metal layers.

We understand under magnetic field enhanced sputtering all kinds of RF, DC, DC and AC sputtering with magnetic fields applied to form tunnel shaped pattern of magnetic field-flux on and adjacent the surface to be sputtered and/or a flux pattern between said surface and other parts of a sputtering apparatus.

Although it is possible to inventively use any of the magnetic field enhanced sputtering techniques and to thereby sputter a material which is a predominant component of the metallic layer, the best modes of realization known to the inventors today is magnetron sputtering and/or sputtering a metal or a metal alloy.

It has been recognized by the inventors that primarily the overall processing time is shortened by performing the magnetic field enhanced sputtering of the said material directly in a carbon containing gas plasma.

As a result the environmental stability and processing time of the coating is improved with respect to such layers equally sputter deposited, but in a helium containing gas plasma. In view of the fact that the U.S. Pat. No. 4,957,603 teaches to pretreatment the plastic material surface before metal layer is deposited and in the light of the explanations taught therein, the inventively reached results without such pretreating are astonishing.

It is a further object of the present invention to provide such a method in which the plasma discharge of the sputtering is operated with an argon/methane gas mixture.

Following the object-of shortening and commercially simplifying the coating process, it is thereby further proposed to keep the gas mixture ratio substantially constant during the coating, so that no mixture ratio adjustment and corresponding control must be performed during the coating process.

Additionally or alternatively to keeping the gas mixture ratio constant, the last mentioned object is proposed to be reached by keeping the pressure in the vacuum chamber substantially constant during the coating process, which per se or additionally to keeping the said ratio substantially constant, significantly simplifies the overall process control.

As a further object of the present invention, the above mentioned method is proposed to be performed with a carbon containing gas, containing 3 to 10% methane (both limits included), which optimizes environmental stability, adherence and processing time.

Additionally or alternatively keeping the gas mixture ratio and/or the pressure in the vacuum chamber constant, it is proposed to keep the electrical power of the sputtering device substantially constant during the coating process.

It is an important object of the present invention to further perform the said method on a PMMA plastic material. This especially for a PMMA material workpiece which is structured as an optical storage disk.

Thereby, it is further proposed to sputter deposit a highly reflecting metal on the said PMMA optical storage disk structure workpiece, preferably of aluminum or of an aluminum alloy.

It is a further object to significantly improve the economy of processing by performing said method with a cycle time of less than 10 seconds, preferably between 5 to 6 seconds, for metallically coating a PMMA optical storage disk body with a highly reflecting metallic, e.g. metal layer, preferably of aluminum or an aluminum alloy. Thereby, this last mentioned short processing time still results in coated PMMA optical disks which comply with the IEC 856 and 857 norm and is more than 30% improved compared to known cycle times.

(IEC 856, p. 15, 5.1 to 5.3; p. 17, 6 / IEC 857, p. 15, 5.1 to 5.3; p. 17, 6)

Such short processing times increase product throughput significantly and thereby act to lower the cost of manufacturing.

A further object of the present invention is to provide an optical storage disk of aluminum or aluminum alloy coated PMMA, whereby the said metallic coating has been sputtered in a gas atmosphere of a gas mixture of argon and a carbon containing gas. Such an optical storage disk provides for a supreme coating stability to the PMMA plastic body of the disk and for a supreme inexpensive manufacturing, as one of the cost-parameters of such a disk.

As a further object of, the present invention, the optical storage disk is proposed which is produced by applying the said aluminum or aluminum alloy coating in less than 10 seconds, preferably in 5 to 6 seconds, and still complying with the IEC 856 and 857 norm. Due to the mentioned short duration of the coating process, such disk becomes most economically processable and is thus, due to higher process throughput, basically of lower manufacturing price.

It is a further object of the present invention to propose an apparatus for high-rate coating at least one workpiece at a time of plastic material with a metallic, e.g. metal layer which economically produces a metallic coating of excellent adherence and environmental stability. This is realized by an apparatus which comprises a vacuum chamber with at least one magnetic field enhanced sputter source of a predominant component of the layer and wherein the vacuum chamber is connected by controllable gas feed means to a gas mixture tank containing argon and a carbon containing gas or to at least two tanks, respectively containing argon and a carbon containing gas, and which apparatus further comprises an evacuating pump unit, means for feeding at least one workpiece into the said chamber and means for removing at least said one workpiece from said chamber.

By providing as a sputtering source a magnetic field enhanced sputtering source as for instance and in a preferred form a magnetron sputtering source for the said component, coating efficiency is significantly improved, whereby providing said gas tanks leads to the realization of a sputtering plasma atmosphere which provides for improved layer adherence and environmental stability in combination with avoiding a time consuming pretreatment of the bulk material's plastic surface before efficient—full sputter rate—layer deposition.

As a further object of the present invention, it is proposed to provide said one gas mixture tank or one of said gas tanks containing methane as the carbon containing gas component to realize the sputter coating plasma gas atmosphere.

It is a further object of the invention to provide the apparatus with, separately, one tank comprising argon and one tank comprising methane and further providing at said apparatus controllable mixing means to mix a gas mixture fed to the vacuum chamber from the said two tanks, one of them comprising methane. It has been found that providing a gas mixture for sputtering of said component with 3 to 10% methane, preferably with about 5% methane, results in improved processing time and improved adherence strength and environmental stability.

It is a further object to provide the said apparatus with high throughput rates of said workpieces, in that it is proposed to provide said apparatus with a timing unit to control said means for feeding and said means for removing to result in a time span between feeding and removing the respective workpieces into and from the vacuum chamber in time intervals of less than 10 seconds.

BRIEF DESCRIPTION OF THE DRAWINGS

The invention will be better understood and objects other than those set forth above will become apparent when consideration is given to the following detailed description thereof. Such description makes reference to the annexed drawings, wherein:

FIG. 1 shows, in section, a very simple configuration of an inventive apparatus in which the inventive method is practised especially for producing optical storage disks of PMMA bulk material according to the one embodiment of the invention.

Figure 1:
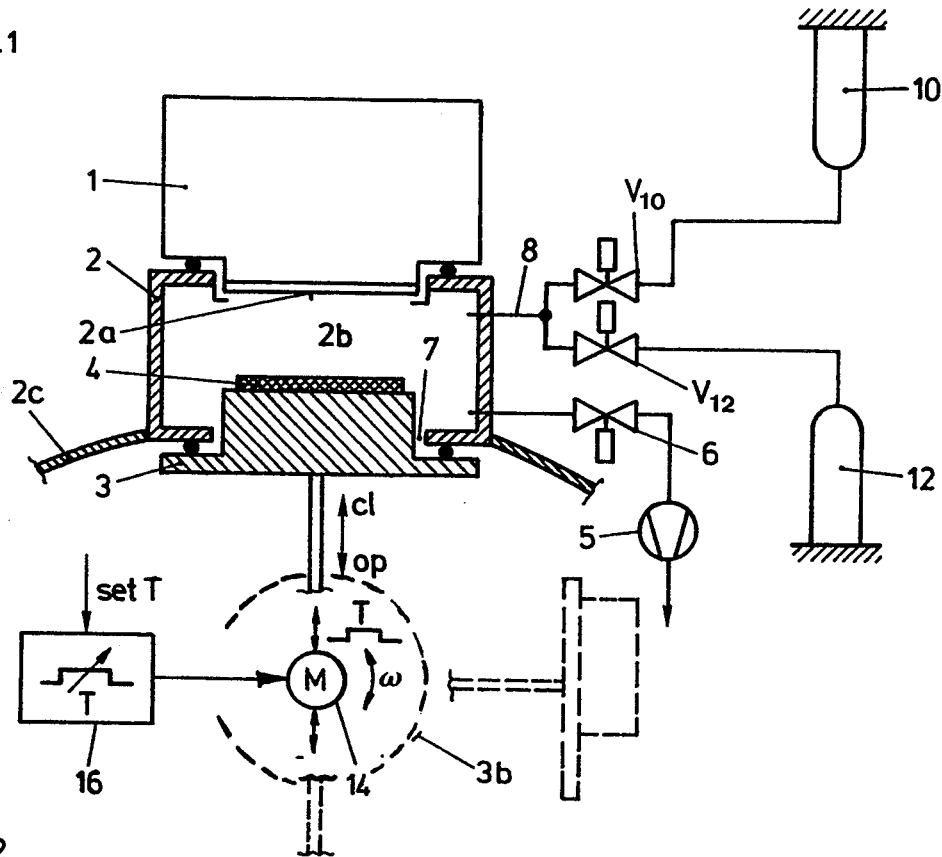
FIG. 1 is a schematic cross-section of an apparatus according to the invention for practising the inventive coating method, especially to produce optical storage disks according to the present invention.

The apparatus comprises a vacuum chamber 2 onto which a sputtering source which is magnetic field enhanced, namely e.g. a planar magnetron source 1, is attached with a vacuum tight seal. The vacuum chamber 2 comprises further, opposite to the target 2a of the planar magnetron source 1, a handling opening 7 through which a single plastic material workpiece 4 is fed or removed into or from the vacuum chamber 2. To handle the workpiece 4 of plastic material there is provided a driven lifting device 3. When introducing the workpiece 4 into the vacuum chamber 2, the lifting device 3 is driven in direction 'cl' up to provide vacuum tight seal, closing the handling opening 7 in the chamber 2.

A pumping unit 5 is connected via the control valve 6 to the inside of the chamber 2. A gas inlet arrangement 8 communicating with the inside of the chamber 2 is connected respectively to a first gas tank 10 and to a second gas tank 12 via respective control valves $V_{10}$ and $V_{12}$.

The lifting device 3 is, as schematically shown, driven by a drive arrangement 14 as by a pneumatic drive cylinder which drive arrangement 14 is time controlled by means of a controllable timing unit 16.

The gas tanks 10 and 12 contain gases which are allowed to feed to the inside of the vacuum chamber formed by chamber 2, magnetron sputtering source 1 and closing device 3, a gas mixture of argon and of a carbon containing gas. Such gas mixture is preferably mixed in a selected ratio by the valve $V_{10}$ and $V_{12}$ from respective separate tanks 10 and 12 for argon and the said carbon containing gas. It is, nevertheless, possible to provide only one gas tank with the said gas mixture of argon and a carbon containing gas premixed and to meter the mass flow 2b of gas mixture per time unit introduced to the inside of vacuum chamber, by means of a single control valve (not shown).

The preferred mode of operation of the apparatus according to FIG. 1 for producing optical storage disks consisting of a PMMA bulk material substrate or disk body as workpiece 4 and being coated on its surface which is also made of the same PMMA bulk material, with a metal layer preferably of aluminum or an aluminum alloy, will now be described.

The target 2a of the planar magnetron sputtering source 1 is made of the metal to be deposited on the PMMA substrate 4, aluminum or an aluminum alloy being the preferred material. First, the lifting device 3 is lowered in direction 'op' according to FIG. 1 and the PMMA Substrate 4 is deposited preferably by robotic means on the lifting device 3.

Thereby, due to the requirements with respect to cleanness of the atmosphere in the vacuum chamber 2 the lifting device 3 will not be lifted in ambient atmosphere, but will open the opening 7 of treating vacuum chamber 2 into a further vacuum chamber which is schematically shown with parts of its wall 2c in FIG. 1. The lifting device 3 may form a part of a handling and distributing device in the prechamber 2c by which more than one of the treating chambers 2 are served with substrates 4 to be coated. Such treatment chambers linked to the prechamber 2c may also comprise other treatment chambers, for instance a heating chamber, or the prechamber 20 per se may be provided for degasing the substrate. The evacuation of the prechamber formed by the walls 2c may be performed by the same evacuating pump 5 as the chamber 2 or may be provided with separate evacuating means. Additionally, the gas inlet arrangement 8 may be used to vent chamber 2 as soon as the lifting device is removed from its seal at opening 7 to prevent the atmosphere within prechamber 2c from substantially affecting the treating atmosphere within chamber 2.

As a second step, the device 3 is closed in direction 'cl' under the control of the timing unit 16 and driven by the driving arrangement 14 which again may be a part of a handling arrangement in the prechamber, so for instance a drive for a specific lifting device 3 or a lifting device star structure, controllably rotated in the prechamber to serve two or more than two openings therein by one or more than one lifting device arm. Provision of a rotatable star-arrangement 3b with lifting device-3-arms is schematically shown in FIG. 1 in dashed lines. After sealing the inside of the chamber 2 via the upward motion of lifting device 3, which has been loaded with substrate 4 to be coated, the vacuum pumping arrangement 5 is enabled, pumping the inside 2b of vacuum chamber 2 down to operating pressure level of a few micro bars.

After reaching the desired pressure, argon and a carbon containing gas are inlet from the tanks 10 and 12 under the control of valves $V_{10}$, $V_{12}$. When a predetermined gas mixture at a predetermined partial pressure and/or at a predetermined operating pressure is achieved in the chamber 2, the electric power to the magnetron source 1 is applied and the material of target 2a, namely aluminum or an aluminum alloy, is magnetron sputtered in the gas mixture plasma, the gas mixture ratio of argon and carbon containing gas, preferably methane, being preferably kept constant.

After the substrate 4 of PMMA material has been surface coated by the aluminum or aluminum alloy layer, the evacuating pump 5 may possibly be disabled, pressure in the vacuum chamber 2 is allowed to rise for example by operating a leak valve (not shown) and then the device 3 is lowered in direction 'op' into the prechamber under the control of the time control unit 16.

The ratio of argon and preferably methane may be selected in a wide range. Nevertheless, very good results were attained with a gas mixture ratio of 3 to 20% by volume (both limits included) methane in argon, preferably 3% to by volume (both limits included) and more preferably of about 5% by volume methane in argon. The timing unit 16 which is adjustable for controlling the closing and opening of device 3 is set to preferably provide for a time span between the sealing of closing lifting device 3 and opening said device 3 to remove the now coated workpiece 4, of less than 10 seconds, preferably 5 to 6 seconds.

Optical storage disks of PMMA with aluminum or aluminum alloy coatings produced as described with the apparatus of FIG. 1 and also with the apparatus of FIG. 2 to be described later, fully comply with the IEC 856 and 857 standard for prerecorded optical reflection video disks.

Figure 2:
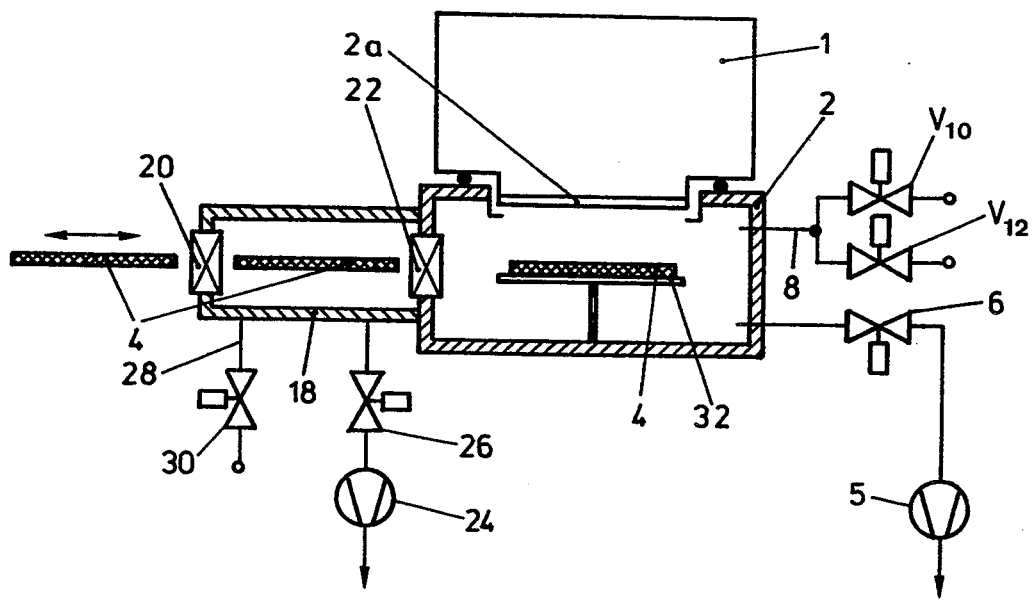
FIG. 2 shows a schematic cross-section of a preferred inventive apparatus in a second mode of realization.

An inventive apparatus as a preferred embodiment according to FIG. 2, performing the inventive method, especially to produce the inventive optical storage disks, is basically built up according to the apparatus of FIG. 1, namely comprising a planar magnetron 1, a vacuum chamber 2 and metal target 2a, preferably of aluminum or an aluminum alloy for producing the inventive PMMA optical storage disk on the PMMA substrate 4.

The inside of the vacuum chamber 2 is again connected to the evacuation pump 5 via a control valve. The gas mixture is further applied via inlet 8, control valves $V_{10}$ and $V_{12}$ to the respective gas tanks 10 and 12 shoe in FIG. 1, not shown in FIG. 2, or from a single gas mixture tank via a metering control valve.

The apparatus of FIG. 2 comprises a load lock prechamber 18 for loading uncoated PMMA substrates 4 into the chamber 2 and unloading coated PMMA substrates 4 from the said chamber: The load lock prechamber 18, comprising load lock valve 20 and 22, is provided with a load lock pumping unit 24 connected via control valve 26 to the load lock cheer and is provided with an additional gas inlet 28 controlled by a further control valve 30, which functions as a leak valve for pressurizing chamber 18 to ambient before opening valve 20.

According to FIG. 2, the loading, transferring and removing of workpiece 4 proceeds horizontally, but could obviously also be performed with a vertical component or vertically. This movement may be linear, arcing or circular. In the chamber 2 the workpieces fed through the load lock arrangement 18 are deposited on a support 32.

The operation of the apparatus according to FIG. 2, wherein, as is obvious for the man skilled in the art, a time control unit in analogy to unit 16 of FIG. 1, which controls feeding of workpieces through the load lock chamber 18 to the chamber 2 and removing of the workpiece 4 from the chamber 2, acts on robotic transport means, thereby transporting the workpieces to and from the chamber 2 (not shown in FIG. 2). Such robotic transport means are widely known in the art.

Processing takes place in analogy to that which was explained in connection with FIG. 1. Here, too, the important cycle time T for coating the PMMA substrates 4, important under the aspect of economic high throughput production, was kept below 10 seconds and preferably as low as 5 to 6 seconds, whereby here T was defined from entering valve 20 to leaving valve 20 first by the uncoated then by the coated disk.

A preferred realization of the load lock chamber 18 as schematically shown in FIG. 2 is described and claimed in the U.S. Pat. No. 5,017,073 assigned to Balzers Aktiengesellschaft which disclosure is integrated in the present description by reference.

A further preferred apparatus which is inventively used is disclosed in the German laid open print no. AA 41 17 969 A1 and is subject to the U.S. application Ser. no. 07/888,111, filed May 26, 1992, both assigned to Salzers Aktiengesellschaft.

In the following table the characteristics of PMMA based optical storage disks, according to the present invention, are shown in comparison with PMMA based optical storage disks produced according to state of the art processes.

Additional to the fact that the inventive method allows the metallization of laser disks so as to fully comply to the IEC 856 and IEC 857 standard with an apparatus according to FIG. 2 or with a load lock arrangement according to the U.S. Pat. No. 5,017,073 mentioned above or as schematically shown in the FIGS. 1 and 2 in less than 10 seconds from loading an uncoated disk into the apparatus until the same disk, now coated, leaves the apparatus, the final product exhibits a superior environmental stability which is for such devices of predominant importance. This shall be demonstrated in table I wherein the results of a comparison of test values for an accelerated environmental test are listed for samples of coated disks A to C which were purchased in the market, samples D and E were produced by Batch-evaporation using different brands of PMMA, and sample F was inventively produced with an apparatus according to FIG. 2 on disks of the same PMMA material as the disks of sample E.

In row Δ SNR the signal to noise ratio reduction of the tested disks is listed after performing the environmental test with respect to that value obtained before the environmental test was performed. In row Δ pp the reduction of laser tracking signal is listed again after the environmental test with respect to this value before the environmental test.

In row Δ BLER the increase of block error rate deterioration is listed, relative to that value obtained before performing the environmental test. All measurements were performed within the range of a minimum of two respective disks and of a maximum of four respective disks and the average values were listed.

The SNR is defined: IEC 856, p. 29, 12.2.2 IEC 857, p. 31, 12.2.2

The pp (push-pull tracking) is defined: IEC 856 amendments, p. 3, 12.1.4 to 12.1.4.5.2 IEC 857 amendments p. 3, 12.1.4 to 12.1.4.5.2.

The BLER is defined: IEC 856 amendments item 1, p. 2, 2.6 to 2.6.3 IEC 857 amendments item 2, p. 2, 2.6 to 2.6.3.

The following accelerated environmental test was used:

The disks were tested in order to determine pre-environmental testing performance and thereby video signal to noise ratio, digital audio block error rate and the push-pull tracking A-B signals for each disk before environmental testing.

The disks were then placed in an environmental testing chamber and subjected to the following conditions:

18 hours at 70° C. and 60% relative humidity;
8 hours at room temperature and humidity;
228 hours at 60° C. and 90% relative humidity.

The disks were then allowed to stabilize for 24 hours at room temperature and humidity before the respective post-environmental testing was performed.

TABLE I

PLAYBACK PERFORMANCE DETERIORATION AFTER ENVIRONMENTAL TESTING

|  | A | B | C | D | E | F |
|---|---|---|---|---|---|---|
| Δ pp(A-B) | 23% | 7% | 14% | 7.84% | 5% | 4.1% |
| Δ SNR | 0.84 db | 0.98 db | 2.91 db | 2.66 db | 2.25 db | 0.75 db |
| Δ BLER | 63% | 40% | 87% | 57% | 126% | 34% |

A: Warner specialty records
B: Unknow Japanese company, manufactured in Japan
C: Pioneer video, USA
D: Technidisc, ICI CP-51-PMMA
E: Technidisc, Rohm and Haas VLD-100 PMMA
F: Technidisc, inventively methane process sputtered discs, Rohm and Haas VLD-100 PMMA Sputter process parameters:

| total pressure: | 1,6 Pa (1,6 × $10^{-2}$ mbar) |
| sputter power: | 18 kW |
| sputtering time: | 5.5 sec |
| flow ratio $CH_4/Ar$: | 5,8% |

From table I it becomes evident that the inventively processed PMMA disks are of considerably higher stability to environmental exposure. The reduction in their properties with respect to all three test parameters measured is considerably better compared to prior art manufactured disks, for instance according to A to E.

We claim:

1. A method of making an optical storage disk comprising:
providing a disk body of PMMA bulk material having a surface of the same PMMA bulk material; and
applying a coating of one of aluminum and an aluminum alloy acting as a light reflecting layer, and as a first layer, directly on the surface of said PMMA body to form a coated body, by a sputtering process in a sputtering apparatus, the sputtering process taking place in one of a DC-, RF-, and DC- with superimposed AC- discharge, with a magnetic field applied during the process to form one of a tunnel-shaped pattern of magnetic field flux on and adjacent a surface of a material to be sputtered, and of a flux pattern between the surface of the material to be sputtered and other parts of the sputtering apparatus, the coating further being applied in a sealed gas atmosphere containing argon and a carbon containing gas in the sputtering apparatus during the sputtering process, said coating being applied on the PMMA surface of said PMMA body by means of inserting said body with said PMMA surface into said sealed gas atmosphere, and immediately igniting said discharge and starting said sputtering process without pretreatment to said PMMA body surface in said sputtering apparatus.

2. The method of claim 1, wherein said coating is applied by magnetron sputtering.

3. The method of claim 1, wherein said coating is applied in a time-span between inserting said PMMA body in the sputtering apparatus and removing said coated body therefrom, said time-span being less than 10 sec., and wherein said coating complies with IEC 856 and 857 standards for prerecorded optical reflection video disks.

4. The method of claim 3, wherein said time-span has a length of between 5 and 6 sec.

5. The method of claim 1, wherein said coating is applied by sputtering in said gas atmosphere containing argon and methane.

6. The method of claim 5, wherein said coating is applied in said sealed gas atmosphere containing Argon and 3% and 20% by volume of methane.

7. The method of claim 5, wherein said coating is applied in said sealed gas atmosphere containing argon and 3% to 10% by volume of methane.

8. The method of claim 1, wherein said coating is applied by sputtering in said sealed gas atmosphere, the composition of the sealed gas atmosphere being kept substantially constant during said sputtering.

9. The method of claim 1, wherein said coating is applied with substantially constant electric sputter power supplied in said sputtering apparatus.

* * * * *